(12) United States Patent
Kameda et al.

(10) Patent No.: US 6,369,487 B1
(45) Date of Patent: Apr. 9, 2002

(54) PIEZOELECTRIC RESONANCE COMPONENT

(75) Inventors: Eitaro Kameda, Omihachiman; Toshiyuki Baba, Moriyama; Jiro Inoue; Shoichi Kawabata, both of Omihachiman, all of (JP)

(73) Assignee: Murata Manufacturing Co., Inc., Kyoto (JP)

( * ) Notice: Subject to any disclaimer, the term of this patent is extended or adjusted under 35 U.S.C. 154(b) by 0 days.

(21) Appl. No.: 09/536,887

(22) Filed: Mar. 28, 2000

(30) Foreign Application Priority Data

Mar. 29, 1999 (JP) .......................................... 11-087163

(51) Int. Cl.⁷ ............................................. H01L 41/04
(52) U.S. Cl. ...................... 310/320; 310/365; 310/348
(58) Field of Search .................................. 310/320, 365, 310/366, 348

(56) References Cited

U.S. PATENT DOCUMENTS

| | | | | |
|---|---|---|---|---|
| 5,942,836 A | * | 8/1999 | Yoshida et al. | 310/320 |
| 6,040,652 A | * | 3/2000 | Kaida | 310/320 |
| 6,051,910 A | * | 4/2000 | Kaida et al. | 310/320 |
| 6,051,916 A | * | 4/2000 | Kaida et al. | 310/368 |
| 6,054,797 A | * | 4/2000 | Wajima et al. | 310/320 |
| 6,107,727 A | * | 8/2000 | Kaida et al. | 310/366 |
| 6,134,762 A | * | 10/2000 | Gamo | 29/25.35 |
| 6,198,200 B1 | * | 3/2001 | Kaida et al. | 310/320 |

FOREIGN PATENT DOCUMENTS

| | | | |
|---|---|---|---|
| JP | 07-111432 | * | 4/1995 |
| JP | 08-335846 | * | 12/1996 |
| JP | 10-190398 | * | 7/1998 |
| JP | 11-163658 | * | 6/1999 |
| JP | 2000-269740 | * | 9/2000 |
| JP | 2001-044795 | * | 2/2001 |
| JP | 2001-044796 | * | 2/2001 |

* cited by examiner

Primary Examiner—Karl Tamai
Assistant Examiner—Peter Medley
(74) Attorney, Agent, or Firm—Keating & Bennett, LLP

(57) ABSTRACT

A piezoelectric resonance component includes a capacitor substrate, a piezoelectric resonator mounted on the capacitor substrate, and a cover member fixedly attached to the capacitor substrate. The capacitor substrate includes a dielectric substrate, a plurality of inner electrodes arranged in layers within the dielectric substrate, and a plurality of outer electrodes disposed on at least one of opposed side surfaces of the dielectric substrate. The plurality of inner electrodes include an inner electrode to be connected to a ground potential and a pair of split inner electrodes located at a common vertical position and spaced apart from each other with respect to a central portion of the dielectric substrate.

19 Claims, 9 Drawing Sheets

PIEZOELECTRIC RESONANCE COMPONENT

BACKGROUND OF THE INVENTION

1. Field of the Invention

The present invention relates to a piezoelectric resonance component for use in, for example, a chip-type piezoelectric oscillator. More particularly, the present invention relates to a piezoelectric resonance component including a piezoelectric resonance element housed in a package that includes a capacitor substrate.

2. Description of the Related Art

A piezoelectric resonance element is housed in a package so as to allow for free vibration of its piezoelectric vibrating portion.

For example, in the case of a piezoelectric oscillator circuit that includes a piezoelectric resonance element, a capacitor is electrically connected to the piezoelectric resonance element. When such a piezoelectric oscillator circuit is to be arranged in the form of a chip-type component, the capacitor is provided within a housing substrate so as to achieve compactness.

For example, Japanese Patent Application Laid-Open (kokai) No. 4-192709 discloses a chip-type piezoelectric resonance component 50 as shown in FIG. 10. The chip-type piezoelectric resonance component 50 includes, as a housing substrate, a capacitor substrate 51 formed by monolithic-ceramic firing technology. A ceramic cap 52 opening downward is soldered to the capacitor substrate 51 via solder 53. In order to improve solderability, a soldering layer 54 is formed with Ag and Pd on the lower surface of the ceramic cap 52, whereas a soldering layer 55 is formed of NiCr and Au on the upper surface of the capacitor substrate 51.

A piezoelectric resonance element 56 is housed in a package defined by the capacitor substrate 51 and the ceramic cap 52. The piezoelectric resonance element 56 includes a piezoelectric substrate 57 and excitation electrodes 58 and 59 provided on the upper and lower surfaces, respectively, of the piezoelectric substrate 57. A portion of the piezoelectric resonance element 56 where the excitation electrodes 58 and 59 overlap each other functions as a vibrating portion which utilizes an energy-trapping-type thickness-shear-vibration mode.

The piezoelectric resonance element 56 is soldered to electrodes 62 and 63, respectively, provided on the upper surface of the housing substrate 51.

A plurality of inner electrodes 64 to 68 are provided within the capacitor substrate 51. The inner electrodes 64 and 65 are electrically connected to a via hole electrode 69 extending through the capacitor substrate 51. A via hole electrode 70 is electrically connected to the lower surface of the inner electrode 66. The inner electrodes 67 and 68 are electrically connected to a via hole electrode 71 extending through the capacitor substrate 51. The via hole electrodes 69 and 71 are arranged such that the upper ends are electrically connected to the electrodes 62 and 63, respectively, and such that the lower ends are electrically connected to terminal electrodes 72 and 73, respectively, provided on the lower surface of the capacitor substrate 51. The lower end of the via hole electrode 70 is electrically connected to a terminal electrode 74 provided on the lower surface of the capacitor substrate 51.

Japanese Utility Model Application Laid-Open (kokai) No. 5-181205 discloses a piezoelectric resonance component 81 as shown in FIG. 11. A capacitor substrate 82 and a cap 83 define a package. Inner electrodes 84 and 85 are disposed within the capacitor substrate 82. An electrode 86a is provided on the upper surface of the capacitor substrate 82 such that the electrode 86a and the inner electrode 85 overlap each other with a dielectric layer disposed therebetween. Similarly, an electrode 86b is provided on the lower surface of the capacitor substrate 82 such that the electrode 86b and the inner electrode 84 overlap each other with a dielectric layer disposed therebetween. The electrodes 86a and 86b are electrically connected together on unillustrated side surfaces of the capacitor substrate 82.

The inner electrodes 84 and 85 are electrically connected to outer electrodes 87a and 87b, respectively, which are arranged so as to cover the corresponding end surfaces of the capacitor substrate 82. The outer electrodes 87a and 87b extend so as to cover portions of the upper and lower surfaces of the capacitor substrate 82. A piezoelectric resonator 90 is soldered to portions of the outer electrodes 87a and 87b which cover the corresponding portions of the upper surface of the capacitor substrate 82. The piezoelectric resonator 90 is an energy-trapping type utilizing a thickness shear-vibration mode. The piezoelectric resonator 90 is enclosed within a space defined by the capacitor substrate 82 and the cap 83.

The piezoelectric resonance component 50 shown in FIG. 10 has the via hole electrodes 69 to 71 provided therein in order to establish an electrical connection between the piezoelectric resonance element 56 and the capacitor substrate 51 functioning as a capacitor and among the terminal electrodes 72 to 74, the capacitor, and the piezoelectric resonance element 56.

Accordingly, fabrication of the piezoelectric resonance component 50 must include a step of forming the via hole electrodes 69 to 71, resulting in an increase in the number of steps required for manufacturing, as well as an increase in the degree of difficulty in processing. A relatively high manufacturing cost for the capacitor substrate 51 is also caused.

Since the via hole electrodes 69 to 71 must be provided in the capacitor substrate 51, the internal electrodes cannot be extended such that the internal electrodes face each other at areas where the via hole electrodes 69 to 71 are located. In other words, the via hole electrodes 69 to 71 prevents an increase in the opposed area of inner electrodes, thus preventing a reduction in size and causing an increase in the required area for mounting.

The presence of the via hole electrodes 69 to 71 impairs the symmetry of the capacitor substrate 51, potentially causing deformation of the capacitor substrate 51 during firing in the manufacturing process. For example, upper and lower portions of the via hole electrode 70 are not symmetrical relative to each other with respect to an imaginary plane that passes through the center of the capacitor substrate 51 and extends parallel to the upper and lower surfaces of the capacitor substrate 51. Such impaired symmetry causes deformation of the capacitor substrate 51, thereby causing poor soldering between the capacitor substrate 51 and the piezoelectric resonance element 56, or formation of a gap between the capacitor substrate 51 and the cap 52 with a resultant impairment in sealing performance. Further, when the piezoelectric resonance component 50 is mounted on a printed circuit board, mounting accuracy may be impaired, or poor soldering may result.

In contrast, the piezoelectric resonance component 81 shown in FIG. 11 does not have via hole electrodes formed in the capacitor substrate 82. Thus, the above-mentioned problems associated with the presence of via hole electrodes do not occur.

When the piezoelectric resonance component 81 is mounted on a printed circuit board, electrical connection therebetween is established via the outer electrodes 87a and 87b and the outer electrodes (not shown) provided on the side surfaces of the capacitor substrate 82 and electrically connected to the electrodes 86a and 86b. The outer electrodes 87a and 87b are provided on the end surfaces of the capacitor substrate 82, whereas the outer electrodes connected to the electrodes 86a and 86b are provided on the side surfaces of the capacitor substrate 82. Accordingly, both end surfaces and both side surfaces of the capacitor substrate 82 must be soldered to the printed circuit board, thus making a mounting process very complicated.

In addition, since capacitance is established by the inner electrodes 84 and 85 and the electrodes 86a and 86b provided on the upper and lower surfaces, respectively, of the capacitor substrate 82, it is difficult to achieve a large capacitance. In order to provide a large capacitance, the number of layers of the inner electrodes 84 and 85 must be increased, causing difficulty in decreasing the thickness of the capacitor substrate 82.

Moreover, since the symmetry of the capacitor substrate 82 is poor, the problems involved in the piezoelectric resonance component 50 occur. For example, the inner electrode portion is not symmetrical with respect to an imaginary plane that passes through the thickness-direction center of the capacitor substrate 82 and extends parallel to the upper and lower surfaces of the capacitor substrate 82 or with respect to an imaginary plane that passes through the center of the capacitor substrate 82 and extends in the thickness direction of the capacitor substrate 82. Thus, the capacitor substrate 82 tends to experience firing-induced warpage.

SUMMARY OF THE INVENTION

To overcome the above described problems, preferred embodiments of the present invention provide a piezoelectric resonance component which achieves a very large capacitance in a capacitor substrate, easily decreases the thickness of the capacitor substrate, and solves the above-mentioned problems caused by the impaired symmetry of the capacitor substrate.

One preferred embodiment of the present invention provides a piezoelectric resonance component including a capacitor substrate, a piezoelectric resonance element mounted on the capacitor substrate, and a cover member fixedly attached to the capacitor substrate in order to enclose the piezoelectric resonance element. The capacitor substrate and the cover member constitute a package for accommodating the piezoelectric resonance element.

The capacitor substrate preferably includes a dielectric substrate having a substantially rectangular shape, a plurality of inner electrodes arranged in layers within the dielectric substrate with a dielectric layer sandwiched therebetween, and a plurality of outer electrodes electrically connected to the inner electrodes and provided on at least one of opposed side surfaces of the dielectric substrate.

The above-described configuration of the outer electrodes enables mounting of the piezoelectric resonance component of preferred embodiments of the present invention on, for example, a printed circuit board simply through connection of the side surface(s) of the capacitor substrate to the board, thereby facilitating an efficient mounting process.

The plurality of inner electrodes preferably include an inner electrode to be connected to a ground potential and a pair of split inner electrodes located at a common vertical position and spaced apart from each other with respect to a central portion of the dielectric substrate. The pair of split inner electrodes face the inner electrode to be connected to a ground potential with the dielectric layer disposed therebetween.

The above configuration of the inner electrodes facilitates an increase in capacitance achieved, thereby enabling a decrease in the thickness of the capacitor substrate with a resultant reduction in the size of the piezoelectric resonance component.

Since the inner electrode(s) to be connected to a ground potential and one or more pairs of split inner electrodes are arranged in layers, the symmetry of the inner electrodes incorporated in the capacitor substrate is easily improved. Thus, even when the capacitor substrate is formed through utilization of monolithic-ceramic firing technology, the capacitor substrate is less likely to be deformed.

Thus, the piezoelectric resonance element is reliably mounted on the capacitor substrate, and the cover member is reliably bonded onto the capacitor substrate without a gap being formed therebetween.

Accordingly, a poor electrical connection does not occur as a result of mounting of the piezoelectric resonance element on the capacitor substrate as well as the mounting of the piezoelectric resonance component on a printed circuit board.

The number of layered inner electrodes is not particularly limited. The inner electrodes to be connected to a ground potential and the pairs of split inner electrodes may be arranged alternatingly in an appropriate number of layers.

Preferably, the plurality of inner electrodes are arranged symmetrically with respect to a first imaginary plane which passes through the center of the capacitor substrate and extends parallel to one pair of side surfaces of the capacitor substrate opposing each other, a second imaginary plane which passes through the center of the capacitor substrate and extends parallel to the other pair of end surfaces of the capacitor substrate opposing each other, and a third imaginary plane which passes through the center of the capacitor substrate and extends parallel to upper and lower surfaces of the capacitor substrate.

Through the unique arrangement and structure of the above-described configuration, the capacitor substrate is prevented from deforming during fabrication thereof.

More preferably, among the plurality of inner electrodes, an inner electrode which is the outermost one in the direction of lamination of the inner electrodes defines the pair of split inner electrodes.

Through the use of the above configuration, stray capacitance between the piezoelectric resonance element and the capacitor substrate is minimized, thereby providing excellent resonance characteristics.

Preferably, the cover member has a cap structure including a downward opening formed therein. However, the cover member is not limited thereto. For example, the structures of the capacitor substrate and the cover member may be modified such that an upwardly projecting annular wall is provided along the circumferential edge of the capacitor substrate, and the cover member has a plate-like shape and is adapted to be joined to the upper edge of the annular wall.

The cover member in the form of the above-mentioned cap can be easily fixed on the capacitor substrate while enclosing the piezoelectric resonance element. The cap and the capacitor substrate define a reliably sealed space for accommodating the piezoelectric resonance element therein.

Preferably, a conductive cap functions as the above-mentioned cap, and the conductive cap is bonded onto the capacitor substrate via an insulating material.

The conductive cap can electromagnetically shield the piezoelectric resonance element.

Alternatively, an insulating cap defines the above-mentioned cap, and the insulating cap is bonded onto the capacitor substrate via an appropriate adhesive.

Use of the insulating cap prevents an electrical connection defect which would otherwise result from conduction between a cap and an electrode provided on the capacitor substrate.

In a certain application of the present invention, an energy-trapping type piezoelectric resonator constitutes the piezoelectric resonance element, and the piezoelectric resonance element and a capacitor incorporated in the capacitor substrate constitute an oscillator circuit.

Through the use of the above configuration, a piezoelectric oscillator that contains a load capacitance is constructed to define a chip-type piezoelectric resonance component.

Other features, elements, characteristics and advantages of present invention will become apparent from the detailed description of preferred embodiments below with reference to the attached drawings.

BRIEF DESCRIPTION OF THE DRAWINGS

FIGS. 3A and 3B are views showing inner electrodes provided in a dielectric substrate included in the capacitor substrate shown in FIGS. 2A and 2B, wherein FIG. 3A is a schematic plan view of split inner electrodes, and FIG. 3B is a schematic plan view of an inner electrode to be connected to a ground potential;

FIGS. 6A to 6C are sectional views of the dielectric substrate included in the capacitor substrate shown in FIGS. 2A and 2B, wherein FIG. 6A is a sectional view taken along line A—A in FIG. 2A, FIG. 6B is a sectional view taken along line B—B in FIG. 2A, and FIG. 6C is a sectional view taken along line C—C in FIG. 2B;

FIGS. 9A and 9B are schematic plan views showing the shapes of inner electrodes used in the capacitor substrate shown in FIG. 8A, wherein FIG. 9A shows an inner electrode to be connected to a ground potential, and FIG. 9B shows split inner electrodes;

DETAILED DESCRIPTION OF PREFERRED EMBODIMENTS

A preferred embodiment of the present invention will next be described in detail with reference to the drawings.

Figure 1:
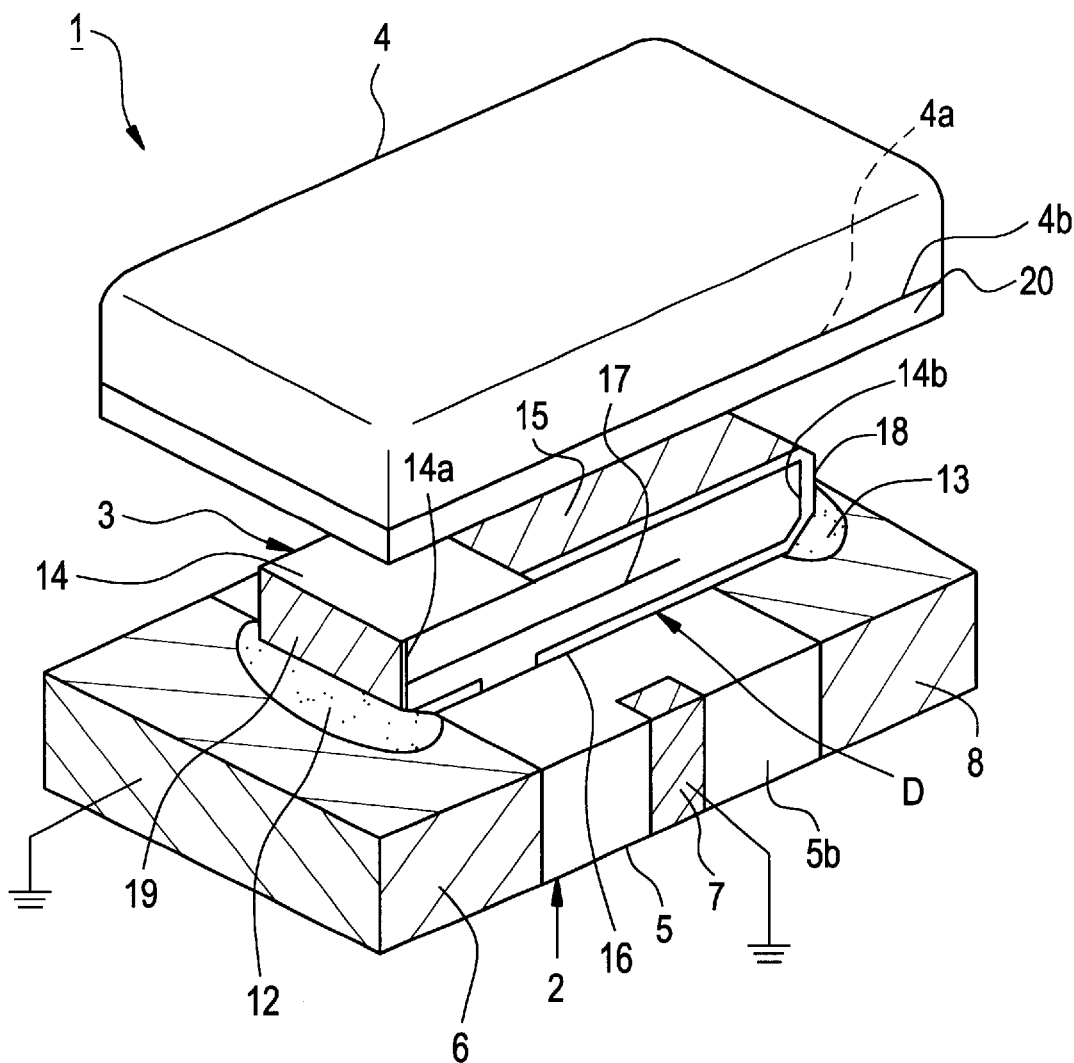
FIG. 1 is an exploded perspective view of a piezoelectric resonance component according to a preferred embodiment of the present invention.

FIG. 1 is an exploded perspective view of a piezoelectric resonance component according to the present preferred embodiment.

A piezoelectric resonance component 1 includes a capacitor substrate 2 and an energy-trapping type piezoelectric resonator 3, which defines a piezoelectric resonance element and is mounted on the capacitor substrate 2. The capacitor substrate 2 and a conductive cap 4 constitute a package.

Figure 2A:
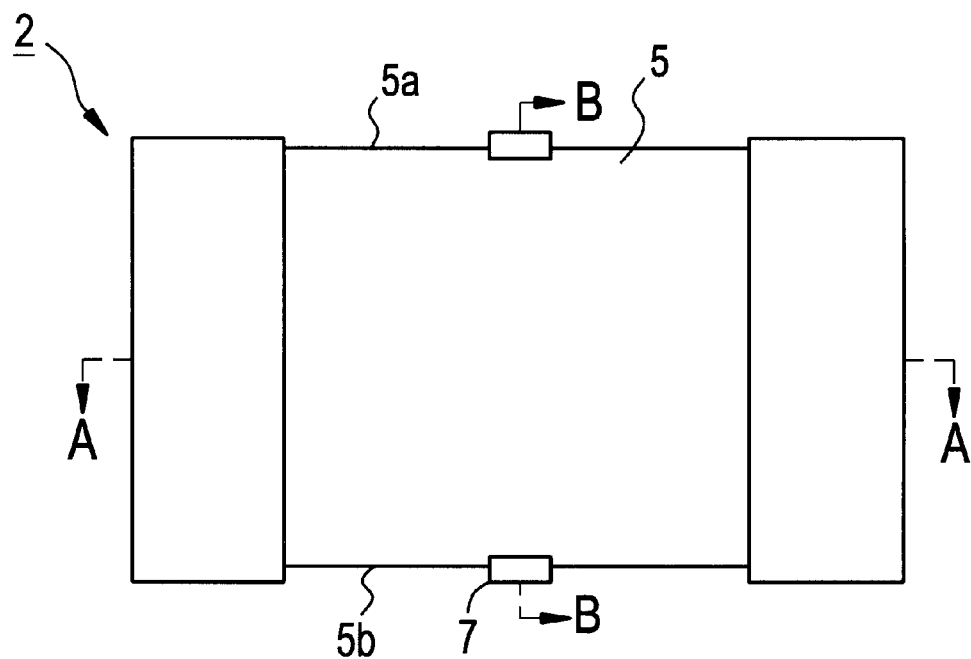
FIGS. 2A and 2B are plan and side views of a capacitor substrate included in the preferred embodiment shown in FIG. 1.
Figure 2B:
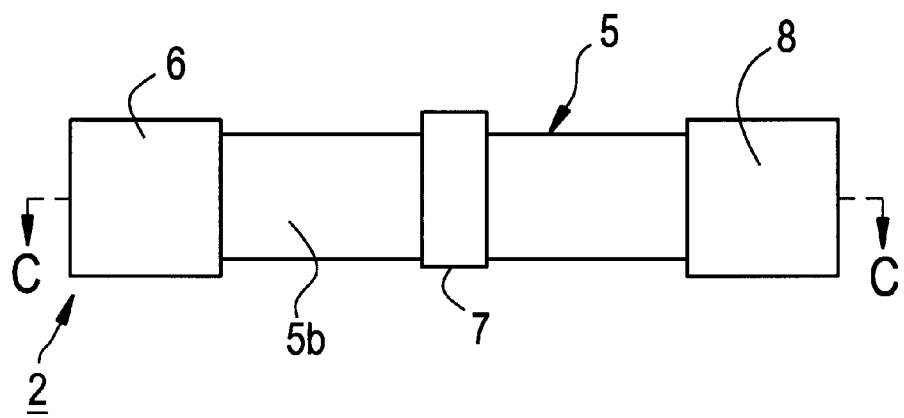

The capacitor substrate 2 includes a dielectric substrate 5 preferably having a substantially rectangular shape. FIGS. 2A and 2B are plan and side views, respectively, of the capacitor substrate 2.

Outer electrodes 6 to 8 are arranged on the capacitor substrate 2 so as to cover at least portions of opposite side surfaces 5a and 5b of the dielectric substrate 5. The outer electrodes 6 and 8 are arranged so as to cover end portions of the side surfaces 5a and 5b. The outer electrodes 6 and 8 are arranged so as to cover not only portions of the side surfaces 5a and 5b but also end surfaces and portions of the upper and lower surfaces of the dielectric substrate 5. The outer electrode 7 is arranged so as to cover not only portions of the side surfaces 5a and 5b but also a portion of the upper surface of the dielectric substrate 5. Also, the outer electrode 7 extends across the lower surface of the dielectric substrate 5.

Figure 3A:
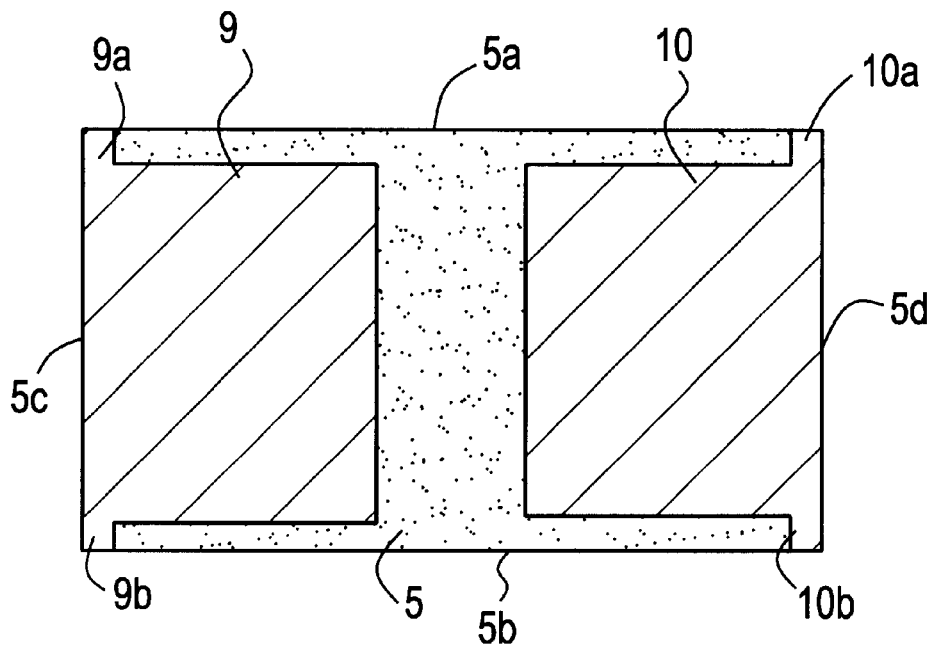
Figure 3B:
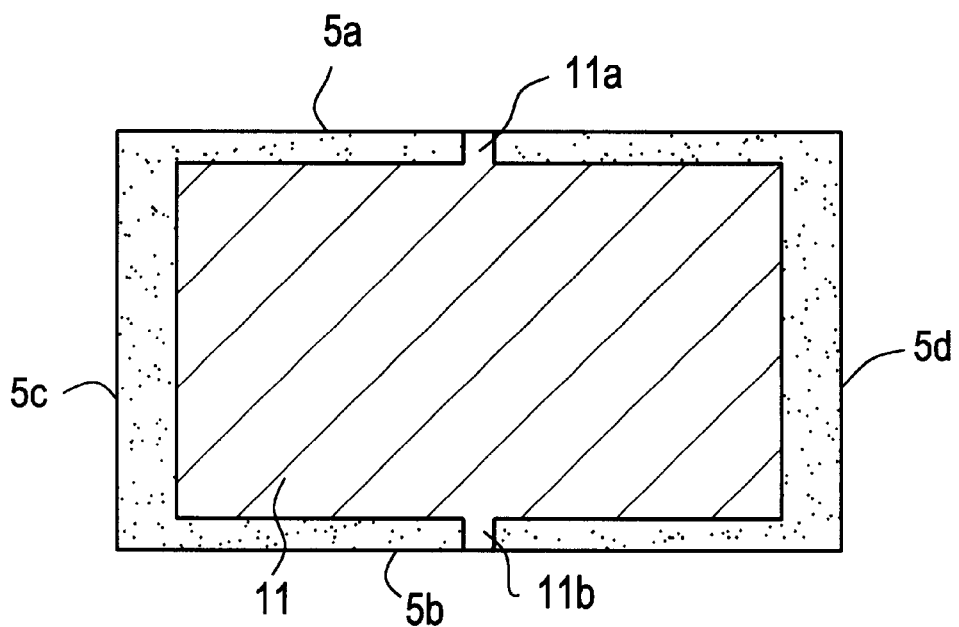

The dielectric substrate 5 includes a paired split inner electrodes 9 and 10 shown in FIG. 3A and an inner electrode 11 to be connected to a ground potential. The paired split inner electrodes 9 and 10 and the inner electrode 11 are arranged in layers.

As shown in FIG. 3A, the paired split inner electrodes 9 and 10 are located at a common vertical position or height within the substrate 5. The paired split inner electrodes 9 and 10 have a construction and arrangement obtained by splitting an imaginary inner electrode extending between the end surfaces 5c and 5d of the dielectric substrate 5 at a central portion of the dielectric substrate 5 and parallel to the end surfaces 5c and 5d.

The split inner electrode 9 (10) has lead portions 9a and 9b (10a and 10b) extending to the side surfaces 5a and 5b, respectively, of the dielectric substrate 5. The lead portions 9a and 9b are connected to the outer electrode 6, and the lead portions 10a and 10b are connected to the outer electrode 8. In the present preferred embodiment, the lead portions 9a and 9b are arranged so as to reach the end surface 5c of the dielectric substrate 5, and the lead portions 10a and 10b are arranged so as to reach the end surface 5d of the dielectric substrate 5.

The inner electrode 11 to be connected to a ground potential is located at a different vertical position or height than that of the paired split inner electrodes 9 and 10. The inner electrode 11 has lead portions 11a and 11b, which extend along the centerline of the dielectric substrate 5 and in parallel with the end surfaces 5c and 5d and reach the side surfaces 5a and 5b, respectively. In this manner, the lead portions 11a and 11b are electrically connected to the outer electrode 7.

Figure 4A:
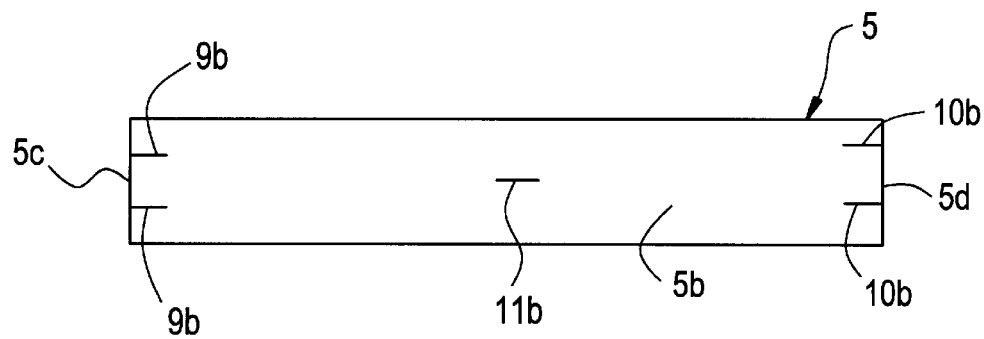
FIGS. 4A and 4B are side and end views of the dielectric substrate included in the capacitor substrate shown in FIGS. 2A and 2B.
Figure 4B:
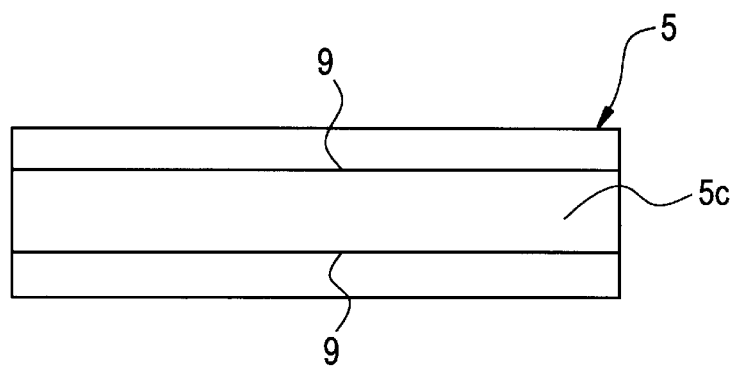

FIG. 4A shows the side surface 5b of the dielectric substrate 5. FIG. 4B shows the end surface 5c of the dielectric substrate 5.

As seen from FIG. 4A, the inner electrode lead portion 11b is exposed on the side surface 5b at the approximate center position with respect to the thickness direction of the dielectric substrate 5. As shown in FIG. 4B, the split inner electrodes 9 are exposed on the end surface 5c.

In the present preferred embodiment, the inner electrodes are arranged in three layers which include the paired split inner electrodes 9 and 10, the inner electrode 11, and the paired split inner electrodes 9 and 10, from top to bottom. In other words, the paired split inner electrodes 9 and 10 are located at the outermost layer of lamination of the inner electrodes.

The split inner electrode 11 and the paired split inner electrodes 9 and 10 are arranged in layers to thereby constitute a capacitor in the capacitor substrate 2. Specifically, the outer electrode 7 is connected to a ground potential to thereby form a capacitor between the outer electrode 7 and the outer electrode 6 and another capacitor between the outer electrode 7 and the outer electrode 8.

Referring back to FIG. 1, the piezoelectric resonator 3 is connected to the upper surface of the capacitor substrate 2 preferably via solder members 12 and 13. The piezoelectric resonator 3 is an energy-trapping type piezoelectric resonator which utilizes a harmonic of a thickness extensional-vibration mode.

Figure 5:
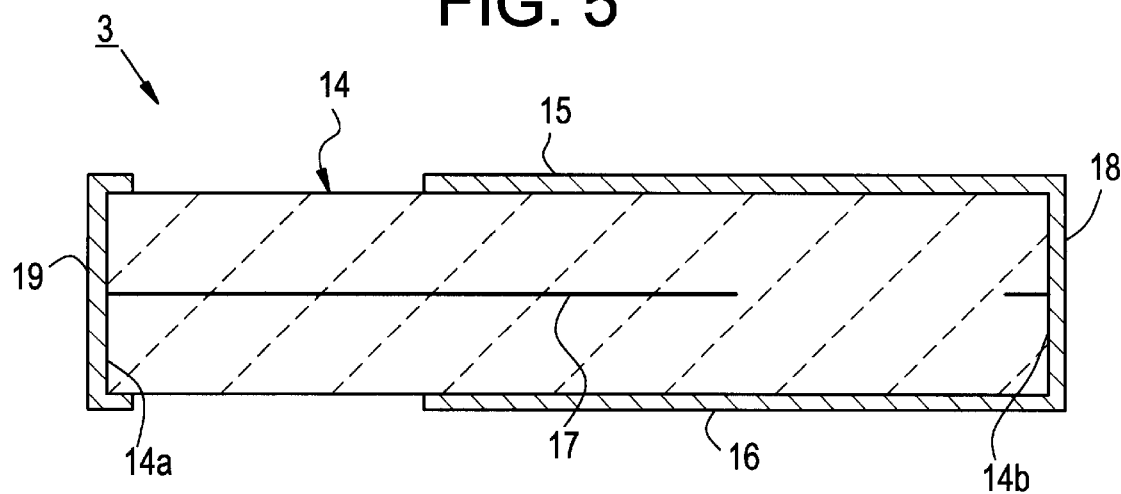
FIG. 5 is a longitudinal sectional view of a piezoelectric resonance element included in the preferred embodiment shown in FIG. 1.

As shown in FIG. 5, the piezoelectric resonator 3 includes a piezoelectric substrate 14 preferably having a substantially slender, rectangular shape. The piezoelectric substrate 14 may be made of a piezoelectric ceramic, such as lead titanate zirconate ceramic, crystal, or an appropriate piezoelectric, monocrystal or other suitable material.

In the case of the piezoelectric substrate 14 made of a piezoelectric ceramic, the piezoelectric substrate 14 is polarized such that the polarization axis extends in the thickness direction of the piezoelectric substrate 14.

A first excitation electrode 15 is provided on the upper surface of the piezoelectric substrate 14, and a second excitation electrode 16 is provided on the lower surface of the piezoelectric substrate 14. An inner excitation electrode 17 is provided in the piezoelectric substrate 14 at an intermediate vertical position or height thereof. The excitation electrodes 15 and 16 and the inner excitation electrode 17 overlap each other in the thickness direction of the piezoelectric substrate 14 while a piezoelectric layer is interposed therebetween. Overlapped portions of the excitation electrodes 15 to 17 define an energy-trapping type vibrating portion.

The excitation electrodes 15 and 16 are electrically connected together via a terminal electrode 18. The terminal electrode 18 extends from the upper surface to the lower surface of the piezoelectric substrate 14 via an end surface 14b.

A terminal electrode 19 is provided on an end surface 14a which is opposite to the end surface 14b. The terminal electrode 19 is electrically connected to the inner excitation electrode 17.

The terminal electrode 19 is arranged so as to reach the upper and lower surfaces of the piezoelectric substrate 14.

In the piezoelectric resonator 3, through application of an alternating-current voltage between the terminal electrodes 18 and 19, the piezoelectric vibrating portion is excited in a thickness extensional vibration mode to thereby trap a harmonic of the thickness extensional vibration mode in the piezoelectric vibrating portion, whereby resonance characteristics based on the harmonic are obtained.

As mentioned previously, the piezoelectric resonator 3 is mounted on the capacitor substrate 2 preferably via solder members 12 and 13. That is, the terminal electrode 19 is electrically connected to and mechanically bonded to the outer electrode 6 of the capacitor substrate 2 via the solder 12.

The terminal electrode 18 of the piezoelectric resonator 3 is electrically connected to and mechanically bonded to the outer electrode 8 of the capacitor substrate 2 via the solder 13. The solder members 12 and 13 are applied so as to have a certain thickness, thereby forming a gap D between the lower surface of the piezoelectric resonator 3 and the upper surface of the capacitor substrate 2. The gap D is provided so as to allow for completely free vibration of the piezoelectric vibrating portion.

The cap 4 preferably includes a conductive material, such as aluminum or stainless steel, and has an opening 4a, which is directed downward in FIG. 1. An insulating adhesive 20 is applied to a lower surface 4b, which surrounds the opening 4a. The conductive cap 4 is bonded to the upper surface of the capacitor substrate 2 preferably via the insulating adhesive 20. By use of the conductive cap 4, the inner piezoelectric resonator 3 is electromagnetically shielded.

In order to reliably prevent electrical conduction between the conductive cap 4 and the outer electrodes 6 and 8, an insulating film (not shown) preferably having a substantially rectangular frame shape may be provided on the capacitor substrate 2, and the conductive cap 4 may be bonded onto the insulating film via the insulating adhesive 20.

Figure 11:
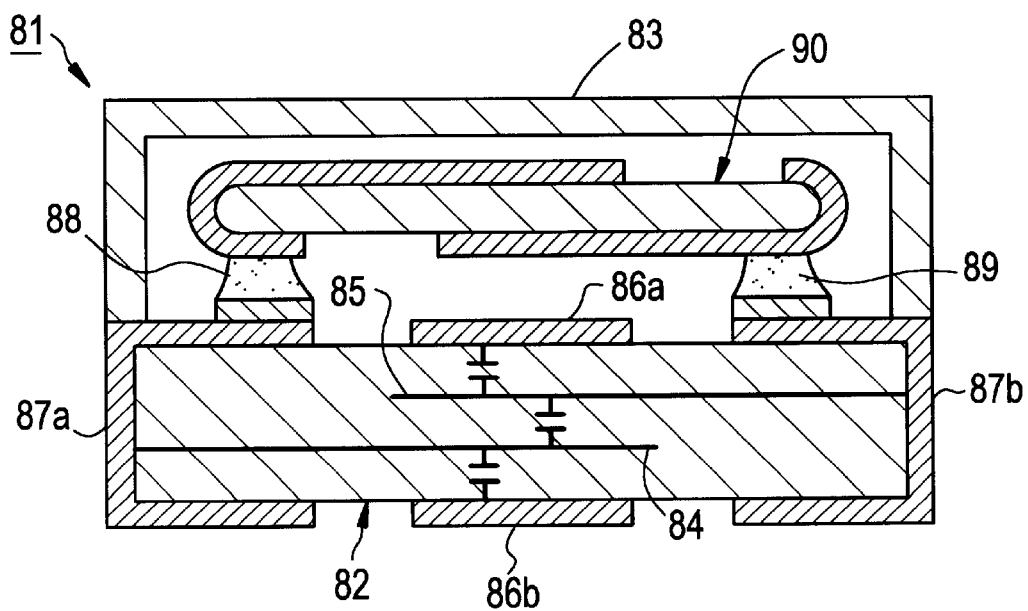
FIG. 11 is a sectional view of another conventional piezoelectric resonance component.

In the piezoelectric resonance component 1 of the present preferred embodiment, the capacitor substrate 2 preferably includes the inner electrode 11 to be connected to a ground potential and the paired split inner electrodes 9 and 10. Thus, when inner electrodes are arranged in the same number of layers, the piezoelectric resonance component 1 can obtain a greater capacitance as compared to the conventional piezoelectric resonance component 81 shown in FIG. 11. In other words, when the same capacitance is to be obtained, the number of layered inner electrodes of the piezoelectric resonance component 1 can be smaller than that of the conventional piezoelectric resonance component 81, thereby reducing the thickness of the capacitor substrate 2.

The paired split inner electrodes 9 and 10 have a construction and arrangement obtained by splitting a imaginary inner electrode extending between the end surfaces 5c and 5d of the dielectric substrate 5 at an approximate central portion of the dielectric substrate 5 and parallel to the end surfaces 5c and 5d. The lead portions 11a and 11b of the inner electrode 11 to be connected to a ground potential extend at an approximate central portion of the dielectric substrate 5 parallel to the end surfaces 5c and 5d and reach the side surfaces 5a and 5b, respectively. Accordingly, in the capacitor substrate 2, the paired split inner electrodes 9 and 10 and the inner electrode 11 can be arranged in layers at a high degree of symmetry. When monolithic-ceramic firing technology is applied during manufacturing of the capacitor substrate 2, the resultant capacitor substrate 2 is less likely to be susceptible to warpage or deformation.

Particularly, according to the present preferred embodiment, in the capacitor substrate 2, the plurality of inner electrodes 9 to 11 are arranged symmetrically with respect to a first imaginary plane which passes through the approximate center of the capacitor substrate 2 and extends parallel to one pair of side surfaces 5c, 5d of the capacitor substrate 2 opposing each other, a second imaginary plane which passes through the approximate center of the capacitor substrate 2 and extends parallel to the other pair of side surfaces 5a and 5b of the capacitor substrate 2 opposing each other, and a third imaginary plane which passes through the approximate center of the capacitor substrate 2 and extends parallel to the opposite upper and lower surfaces of the capacitor substrate 2, thereby further reliably preventing deformation of the capacitor substrate 2 which would otherwise result from firing. This symmetric feature will next be described in detail with reference to FIGS. 6A to 6C.

Figure 6A:
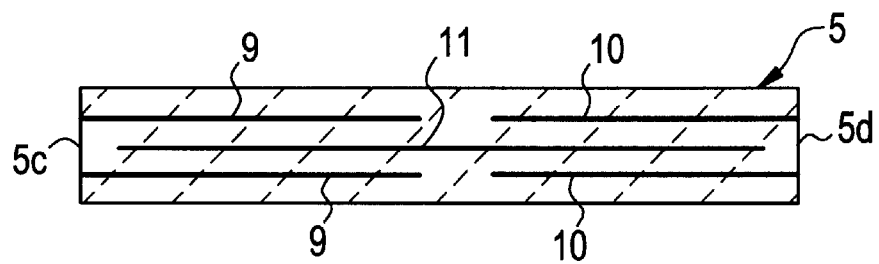

FIG. 6A is a sectional view of the dielectric substrate 5 taken along line A—A of FIG. 2A; i.e., a sectional view taken along the second imaginary plane, which passes through the approximate center of the capacitor substrate 2 and extends parallel to the side surfaces 5a and 5b. The inner electrodes extending toward the far side of the plane of the paper of FIG. 6A are symmetrical to inner electrodes extending toward the near side of the plane of the paper of FIG. 6A with respect to the second imaginary plane.

Figure 6B:
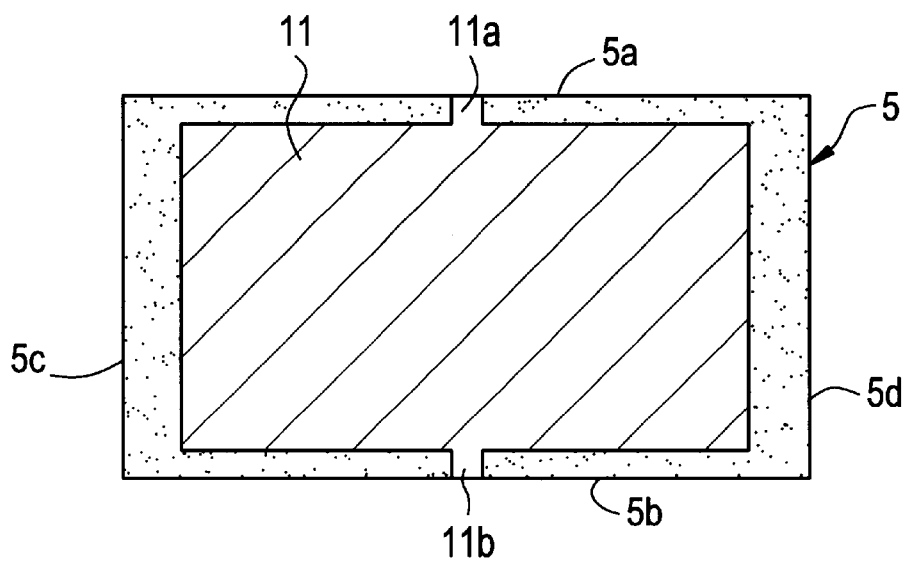

FIG. 6B is a sectional view taken along line C—C of FIG. 2B; i.e., a sectional view taken along the third imaginary plane, which extends parallel to the upper and lower surfaces of the capacitor substrate 2. The inner electrode 11 is disposed on the third imaginary plane, and the paired split inner electrodes 9 and 10 are disposed above and below the third imaginary plane. Thus, a plurality of inner electrodes are disposed symmetrically with respect to the third imaginary plane.

Figure 6C:
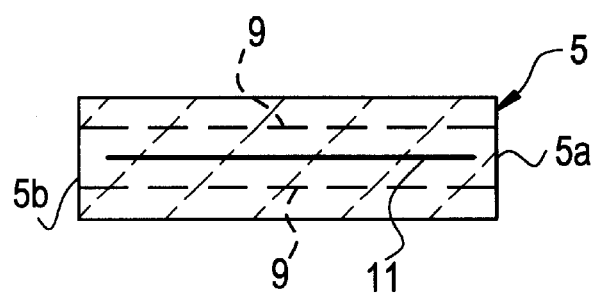

FIG. 6C is a sectional view taken along line B—B of FIG. 2A; i.e., a sectional view taken along the first imaginary plane, which passes through the approximate center of the capacitor substrate 2 and extends parallel to the end surfaces 5c and 5d. The inner electrodes 9 to 11 are also disposed symmetrically with respect to the first imaginary plane.

In the capacitor substrate 2 of the present preferred embodiment, the inner electrodes are disposed symmetrically with respect to the first through third imaginary planes. As a result, deformation of the dielectric substrate 5 is prevented from occurring during manufacturing of the capacitor substrate 2.

According to the present preferred embodiment, a plurality of inner electrodes are disposed symmetrically with respect to the first through third imaginary planes. However, the present invention is not limited thereto. That is, when the plurality of inner electrodes include paired split inner electrodes and an inner electrode to be connected to a ground potential which faces the split inner electrodes via a dielectric layer, the paired split inner electrodes are arranged to be located at a common vertical position in the substrate and separated from each other at an approximate central portion of the dielectric substrate. Therefore, the symmetry of the capacitor substrate is greatly improved.

Accordingly, through the use of the split inner electrodes and the inner electrode to be connected to a ground potential, and the unique arrangement of these elements, even when a plurality of inner electrodes are not disposed symmetrically with respect to the first through third imaginary planes, the symmetry of the capacitor substrate is greatly improved compared to that of the conventional piezoelectric resonance component. Thus, deformation of the capacitor substrate is minimized accordingly.

Among the inner electrodes 9 to 11, the paired split inner electrodes 9 and 10 are located at the outermost layer of lamination of the inner electrodes 9 to 10, thereby reducing stray capacitance between the piezoelectric resonator 3 and the electrode of a ground potential and thus providing excellent resonance characteristics. However, the paired split inner electrodes 9 and 10 are not necessarily required to be located at the outermost layer of lamination.

Figure 7:
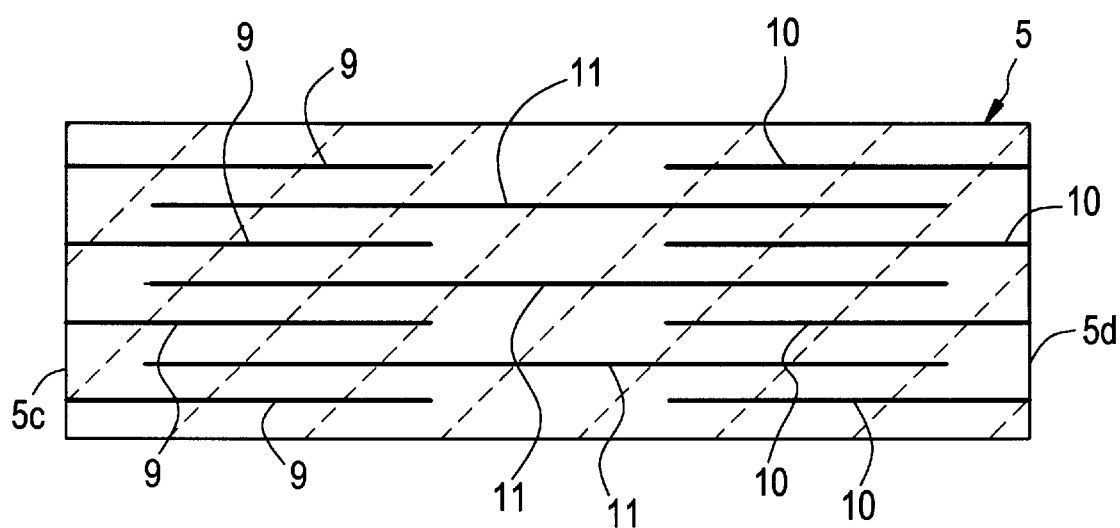
FIG. 7 is a schematic sectional view showing a modification of a plurality of inner electrodes arranged in layers in the capacitor substrate included in preferred embodiments of the present invention.

FIG. 7 is a schematic sectional view showing a modification of a plurality of inner electrodes arranged in layers in a capacitor substrate included in a piezoelectric resonance component according to another preferred embodiment of the present invention.

In the above-described preferred embodiment, the paired split inner electrodes 9 and 10 are disposed above and below the inner electrode 11 to be connected to a ground potential. However, the number of layers of inner electrodes included in the capacitor substrate can be varied as appropriate. For example, as shown in FIG. 7, the paired split inner electrodes 9 and 10 and the inner electrode 11 to be connected to a ground potential are arranged alternatingly in layers so as to total seven layers of inner electrodes.

Also, in FIG. 7, in order to reduce stray capacitance between the piezoelectric resonator 3 and the capacitor substrate 2, the paired split inner electrodes 9 and 10 are located at the outermost layer of lamination. However, the inner electrode 11 to be connected to a ground potential may be located at the outermost layer.

Figure 8A:
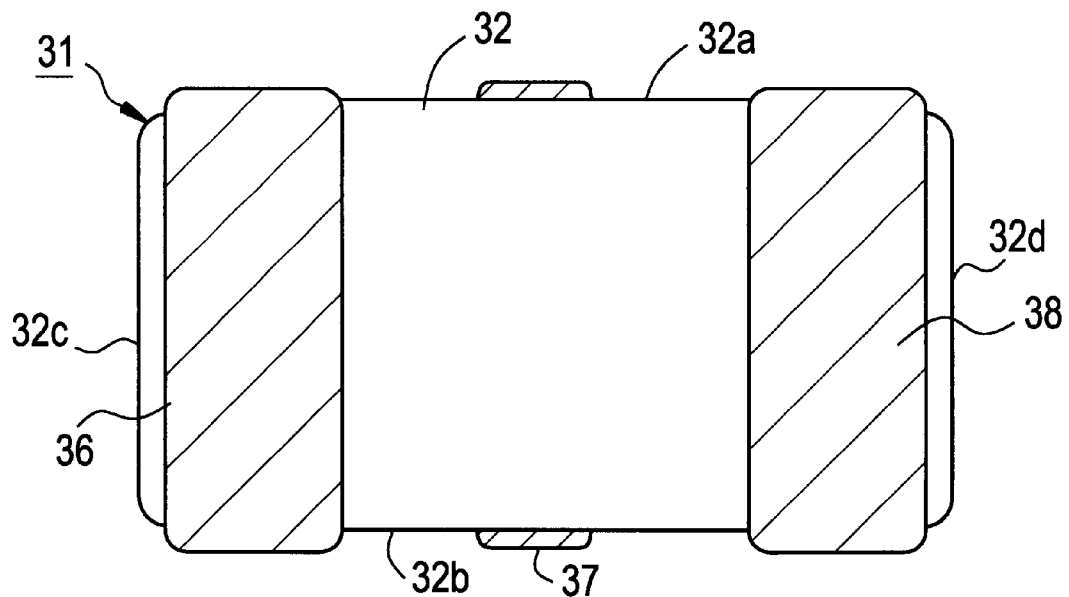
FIGS. 8A and 8B are plan views each showing a modification of the capacitor substrate included in preferred embodiments of the present invention.
Figure 8B:
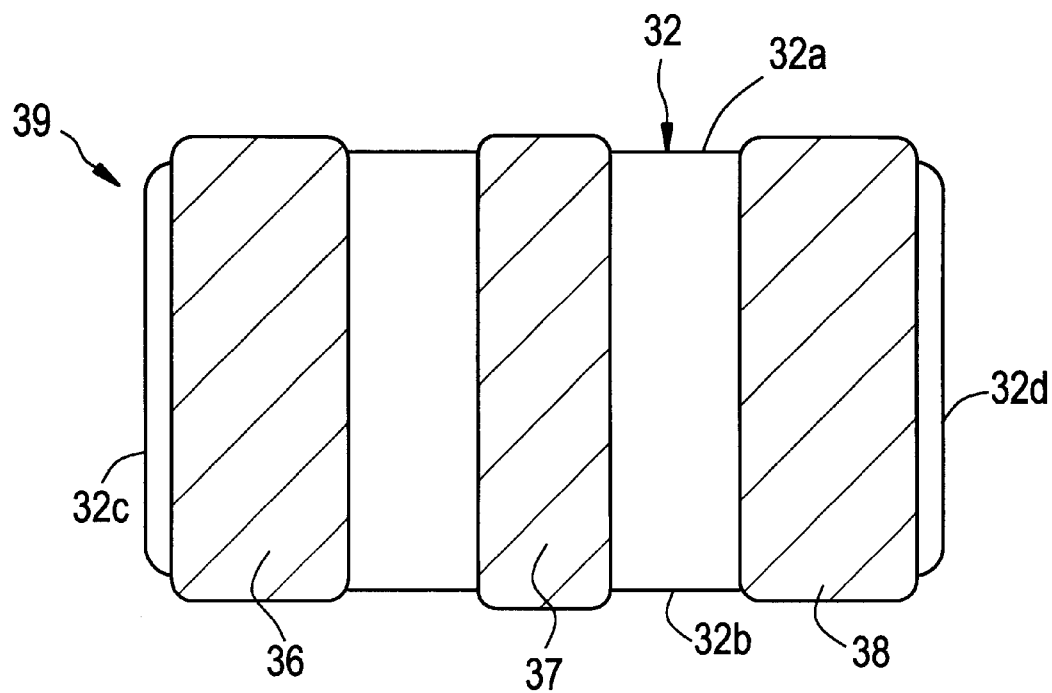

FIGS. 8A and 8B are plan views showing modifications of the outer electrodes 6 to 8 located on the capacitor substrate 2. In a capacitor substrate 31 shown in FIG. 8A, an outer electrode 37 is arranged to cover central portions of opposite side surfaces 32a and 32b of a dielectric substrate 32 and to extend to the lower surface of the dielectric substrate 32.

An outer electrode 36 (38) is arranged on the dielectric substrate 32 in the vicinity of an end portion thereof so as to extend across the side surfaces 32a and 32b and across the upper and lower surfaces of the dielectric substrate 32. In this manner, the outer electrodes 36 and 38 may be arranged so as not to cover end surfaces 32c and 32d of the dielectric substrate 32. Also, in this case, the resultant piezoelectric resonance component can be mounted on, for example, a printed circuit board through soldering to be performed simply on the side surfaces 32a and 32b. Accordingly, as in the case of the above-described preferred embodiment, soldering can be facilitated.

Figure 9A:
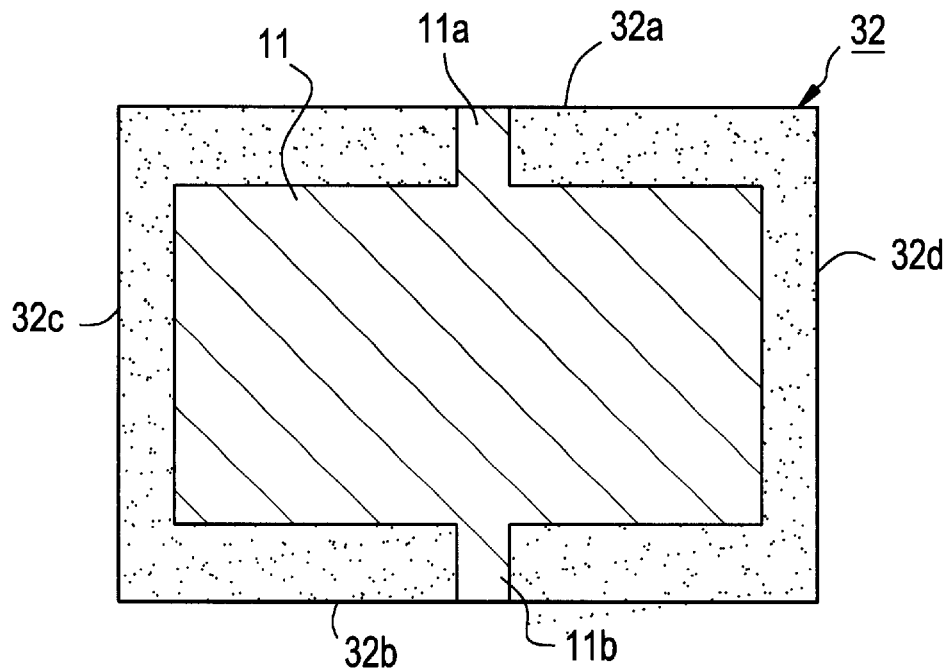
Figure 9B:
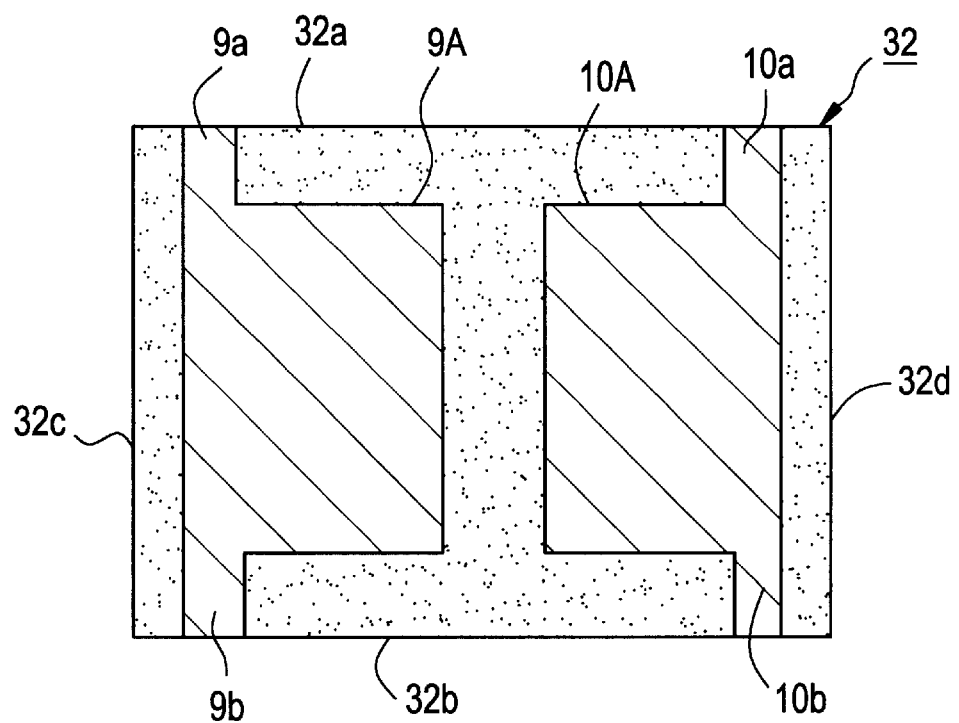
Figure 10:
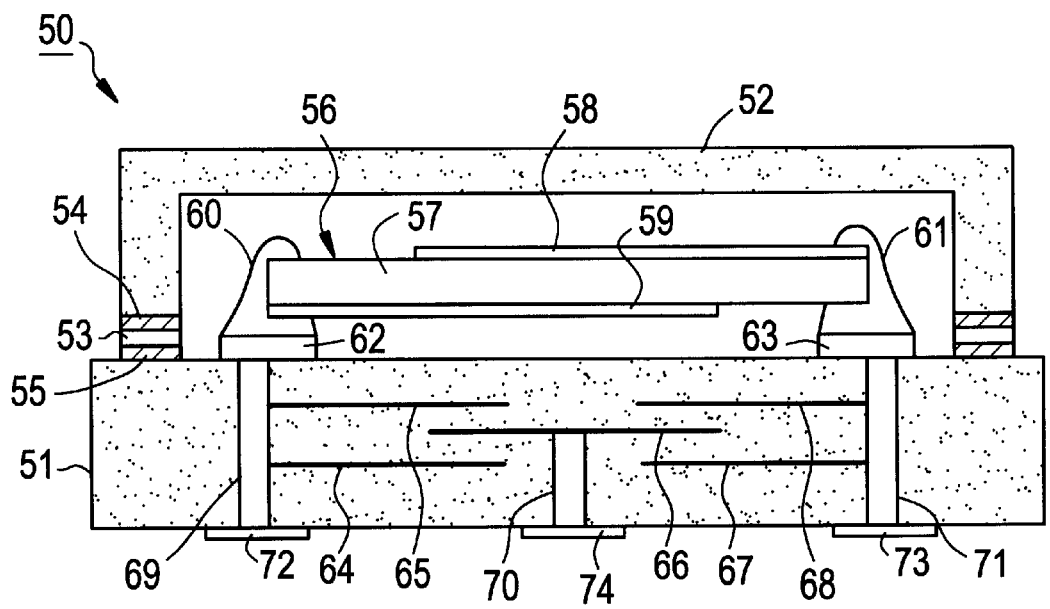
FIG. 10 is a sectional view of a conventional piezoelectric resonance component.

FIGS. 9A and 9B are schematic plan views showing inner electrodes arranged in layers in the dielectric substrate 32 of FIG. 8A. As shown in FIG. 9A, an inner electrode 11 is formed in a manner similar to that of the above-described preferred embodiment. As shown in FIG. 9B, paired split inner electrodes 9A and 10A are arranged so as not to reach the end surfaces 32c and 32d of the dielectric substrate 32. Lead portions 9a, 9b, 10a, and 10b are exposed simply at the side surfaces 32a and 32b. Since the paired split inner electrodes 9A and 10A are not exposed at the end surfaces 32c and 32d, the dielectric substrate 32 achieves greatly improved moisture resistance as compared to the dielectric substrate 5.

In the capacitor substrate 31 shown in FIG. 8A, the outer electrode 37 is arranged so as not to reach the upper surface of the dielectric substrate 32. However, as shown in FIG. 8B, the outer electrode 37, which is to be connected to a ground potential, may be arranged to extend across the upper surface of the dielectric substrate 32. In a capacitor substrate 39 shown in FIG. 8B, the outer electrodes 36 to 38 are arranged to extend across the opposite side surfaces 32a and 32b and across the upper and lower surfaces of the dielectric substrate 32. Since the upper and lower surfaces have the same configurational feature, work for orientating the capacitor substrate 39 during assembly can be omitted.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric resonance component, comprising:

a capacitor substrate;

a piezoelectric resonance element mounted on the capacitor substrate; and a cover member fixedly attached to the capacitor substrate so as to enclose the piezoelectric resonance element, wherein the capacitor substrate includes a dielectric substrate, a plurality of inner electrodes arranged in layers within the dielectric substrate with a dielectric layer sandwiched therebetween, and a plurality of outer electrodes each electrically connected to at least one of the inner electrodes and disposed on at least one of a pair of side-edge surfaces of the dielectric substrate which are opposite to each other; and the plurality of inner electrodes include an inner electrode connected to a ground potential and a pair of split inner electrodes located at a common vertical position within the capacitor substrate and spaced apart from each other with respect to a central portion of the dielectric substrate, the pair of split inner electrodes and the inner electrode connected to a ground potential are arranged to face each other with the dielectric layer disposed therebetween.

2. The piezoelectric resonance component according to claim 1, wherein the plurality of inner electrodes are arranged symmetrically with respect to a first imaginary plane which passes through the approximate center of the capacitor substrate and extends parallel to one pair of side surfaces of the capacitor substrate opposing each other, a second imaginary plane which passes through the approximate center of the capacitor substrate and extends parallel to the other pair of end surfaces of the capacitor substrate opposing each other, and a third imaginary plane which passes through the approximate center of the capacitor substrate and extends parallel to upper and lower surfaces of the capacitor substrate.

3. The piezoelectric resonance component according to claim 1, wherein the pair of split inner electrodes define an inner electrode that is located outermost in the direction of lamination of the inner electrodes.

4. The piezoelectric resonance component according to claim 1, wherein the cover member comprises a cap having a downward opening.

5. The piezoelectric resonance component according to claim 4, wherein the cap is electrically conductive and is bonded onto the capacitor substrate via an insulating material.

6. The piezoelectric resonance component according to claim 4, wherein the cap is insulative and is bonded onto the capacitor substrate via an adhesive.

7. The piezoelectric resonance component according to claim 1, wherein the piezoelectric resonance element is an energy-trap type, and the piezoelectric resonance element and a capacitor provided in the capacitor substrate constitute an oscillator circuit.

8. The piezoelectric resonance component according to claim 1, wherein the dielectric substrate has a substantially rectangular shape.

9. The piezoelectric resonance component according to claim 1, wherein the outer electrodes are arranged on the capacitor substrate so as to cover at least portions of opposite side surfaces of the dielectric substrate.

10. The piezoelectric resonance component according to claim 1, wherein the cover member is conductive and the capacitor substrate and the cover member are arranged to define a package.

11. The piezoelectric resonance component according to claim 1, wherein at least one of the inner electrodes has lead portions arranged so as to reach the end surface of the dielectric substrate.

12. The piezoelectric resonance component according to claim 11, wherein the lead portions are connected to the outer electrode.

13. The piezoelectric resonance component according to claim 1, wherein at least one of the inner electrodes has lead portions arranged so as not to reach the end surface of the dielectric substrate.

14. The piezoelectric resonance component according to claim 1, wherein the pair of split inner electrodes are exposed on an end surface of the capacitor substrate.

15. The piezoelectric resonance component according to claim 1, further comprising solder members arranged to connect the piezoelectric resonance element on the capacitor substrate and arranged to define a gap allowing for free vibration of the piezoelectric resonance element.

16. The piezoelectric resonance component according to claim 1, wherein the piezoelectric resonance element comprises a piezoelectric substrate having a substantially rectangular shape.

17. The piezoelectric resonance component according to claim 16, wherein the piezoelectric substrate is made of one of a piezoelectric ceramic and a piezoelectric monocrystal material.

18. The piezoelectric resonance component according to claim 1, wherein one of the outer electrodes is arranged to cover central portions of opposite side surfaces the capacitor and to extend to the lower surface of the capacitor substrate.

19. The piezoelectric resonance component according to claim 1, wherein the paired split inner electrodes are not exposed at the end surfaces of the capacitor substrate.

* * * * *